(12) United States Patent
Bardos et al.

(10) Patent No.: US 9,508,532 B2
(45) Date of Patent: Nov. 29, 2016

(54) MAGNETRON PLASMA APPARATUS

(71) Applicant: BB PLASMA DESIGN AB, Uppsala (SE)

(72) Inventors: Ladislav Bardos, Uppsala (SE); Hana Barankova, Uppsala (SE)

(73) Assignee: BB PLASMA DESIGN AB, Uppsala (SE)

( * ) Notice: Subject to any disclaimer, the term of this patent is extended or adjusted under 35 U.S.C. 154(b) by 0 days.

(21) Appl. No.: 14/206,197

(22) Filed: Mar. 12, 2014

(65) Prior Publication Data

US 2014/0305795 A1    Oct. 16, 2014

Related U.S. Application Data

(60) Provisional application No. 61/779,597, filed on Mar. 13, 2013.

(51) Int. Cl.
| | |
|---|---|
| *C23C 14/00* | (2006.01) |
| *H01J 37/34* | (2006.01) |
| *H01J 37/32* | (2006.01) |
| *C23C 14/35* | (2006.01) |

(52) U.S. Cl.
CPC ...... *H01J 37/3405* (2013.01); *H01J 37/32596* (2013.01); *C23C 14/352* (2013.01); *H01J 37/342* (2013.01); *H01J 37/3402* (2013.01); *H01J 37/345* (2013.01); *H01J 37/3438* (2013.01)

(58) Field of Classification Search
CPC ............... H01J 37/3402; H01J 37/342; H01J 37/3438; H01J 37/345; C23C 14/352
See application file for complete search history.

(56) References Cited

U.S. PATENT DOCUMENTS

| | | |
|---|---|---|
| 4,166,018 A | 8/1979 | Chapin |
| 4,356,073 A | 10/1982 | McKelvey |
| 4,521,286 A | 6/1985 | Horwitz |
| 4,588,490 A | 5/1986 | Cuomo |

(Continued)

FOREIGN PATENT DOCUMENTS

| | | |
|---|---|---|
| EP | 1033068 B1 | 9/2000 |
| WO | 9616531 A1 | 5/1996 |
| WO | 2007130903 A2 | 11/2007 |

OTHER PUBLICATIONS

Paschen, F. (1916), "Bohrs Heliumlinien" Ann. Phys., 355: 901-902.

(Continued)

*Primary Examiner* — Keith Hendricks
*Assistant Examiner* — Timon Wanga
(74) *Attorney, Agent, or Firm* — Young & Thompson

(57) ABSTRACT

A magnetron plasma apparatus boosted by hollow cathode plasma includes at least one electrically connected pair of a first hollow cathode plate and a second hollow cathode plate placed opposite to each other at a separation distance of at least 0.1 mm and having an opening following an outer edge of a sputter erosion zone on a magnetron target so that a magnetron magnetic field forms a perpendicular magnetic component inside a hollow cathode slit between plates and, wherein the plates and are connected to a first electric power generator together with the magnetron target to generate a magnetically enhanced hollow cathode plasma in at least one of a first working gas distributed in the hollow cathode slit and a second working gas admitted outside the slit in contact with a magnetron plasma generated in at least one of the first working gas and the second working gas.

22 Claims, 3 Drawing Sheets

(56) References Cited

U.S. PATENT DOCUMENTS

| | | |
|---|---|---|
| 4,966,677 A | 10/1990 | Aichert et al. |
| 5,106,474 A * | 4/1992 | Dickey et al. ........... 204/298.14 |
| 5,437,778 A | 8/1995 | Hedgcoth |
| 5,908,602 A | 6/1999 | Bardos et al. |
| 6,283,357 B1 | 9/2001 | Kulkarni et al. |
| 6,296,742 B1 | 10/2001 | Kouznetsov |
| 6,351,075 B1 * | 2/2002 | Barankova et al. ..... 315/111.71 |
| 6,887,356 B2 | 5/2005 | Ford et al. |
| 2009/0260983 A1 | 10/2009 | Bernick |

OTHER PUBLICATIONS

Little, P.F. et al., "The Hollow-Cathode Effect and the Theory of Glow Discharges," Proc. R. Soc. Lond. A 1954 224, pp. 209-227.

Bardos, L. et al., "High Rate Jet Plasma-Assisted Chemical Vapor Deposition," Thin Solid Films, 158 (1988) 265-270.

Glocker, D.A. "Principles and Applications of Hollow Cathode Magnetron Sputtering Sources," (1995) Society of Vacuum Coaters, pp. 298-302.

McLeod, P.S., et al., "Highrate Sputtering of Aluminum for Metallization of Integrated Circuits," J. Vac. Sci. Technol. 14, 263 (1977).

Waits, R. "Planar Magnetron Sputtering," J. Vac. Sci. Technol. 15, 179 (1978).

Window, B. "Charged Particle Fluxes from Planar Magnetron Sputtering Sources," J. Vac. Sci. Technol. 4, 196 (1986).

Rossnagel, S.M., "Magnetron Sputter Deposition with High Levels of Metal Ionization," Appl. Phys. Lett. 63, 3285 (1993).

Musil, J., et al., "Magnetron Discharges for Thin Films Plasma Processing," Materials Surface Processing by Directed Energy Techniques (2006), pp. 67-110.

* cited by examiner

MAGNETRON PLASMA APPARATUS

CROSS REFERENCE TO RELATED APPLICATIONS

This application claims priority to U.S. Provisional Application No. 61/779,597, filed Mar. 13, 2013, the disclosure of which is hereby incorporated by reference in its entirety.

BACKGROUND OF THE INVENTION

The hollow cathode effect and related high-density hollow cathode plasma was invented in 1916 by F. Paschen in his spectroscopy study of the plasma emission. Hollow forms of his electrodes (short rectangular tubes) for igniting the plasma led to considerably more light intensity than in simple planar electrodes at the same direct current (dc) power. Later studies showed that the principle of this intense discharge is based on geometry of the hollow electrode, where electrons emitted from one cathode wall interact with an equivalent electric field with opposite orientation at the opposite inner wall. Depending on gas pressure and distance between electrode walls the electrons can oscillate between inner walls and enhance substantially the ionization of the present gas or vapor. Such ionization based on pendulum motion of electrons is recognized in the literature as "hollow cathode effect" (P. F. Little et al. 1954). The hollow cathode effect can work also in hollow electrode powered by an alternating current (ac). Typical frequency of ac generators for such purpose is between 105 s−1 and 108 s−1, i.e. including the radio frequency (rf) range. The first rf hollow cathode was described in U.S. Pat. No. 4,521,286 to C. M. Horwitz. It was also found that the anode in the rf hollow cathodes is the plasma itself (a "virtual anode") in contact with the counter electrode (L. Bárdos et al. 1988). The hollow cathode effect can be generated also by pulsed dc power.

The hollow cathode effect is not generated in all negatively biased hollow electrodes. A hollow electrode can differ substantially from real hollow cathodes unless its geometry is optimized to enhance the gas ionization inside its hollow part by 1-3 orders of magnitude due to the hollow cathode effect. For example, a large-diameter cylindrical electrode where the space-charge sheath thickness is much smaller than the electrode diameter cannot serve as a hollow cathode. Even at lower gas pressures when the sheath is wider, the effect may not take place due to a low number of ionizing collisions. In order to excite this effect at higher pressures, the distance between walls must be reduced due to short mean free paths of electrons. The distance d between opposite walls of the hollow cathode must be at least twice the thickness of the space charge sheath, which depends on the gas pressure p, but also on the frequency and power of the generator used. Moreover, the gas pressure p inside the hollow cathode is typically higher than outside the hollow cathode due to higher temperature caused by the high density plasma inside the hollow cathode and due to a pressure gradient formed in the flowing gas or by evaporated cathode material. Also, presence of magnetic fields can affect the confinement and properties of the hollow cathode plasma. Therefore, different published empirical formulas for estimations of the optimal product p·d for the hollow cathode effect in in dc hollow cathodes are generally not very useful.

A number of patents and publications describe so-called "hollow cathode magnetron sputtering" in systems having targets with hollow geometry, mostly cylinder. The target is always negative in order to attract ions for bombarding and sputtering, hence the term "hollow cathode target" and "hollow cathode magnetron". However, without the hollow cathode effect, e.g. in large diameter targets or in magnetic fields parallel with the walls of the target where electrons are deflected from their oscillations, such systems are not real hollow cathodes. For example, in U.S. Pat. No. 4,966,677 to H. Aichert et al. a magnetron sputtering apparatus has a hollow cathode target with a cathode base in which a hollow target with cylindrical sputtering surface and cylindrical outer surface is disposed. Neither the parallel magnetic field with the target nor the target geometry allows for the hollow cathode effect. Similarly, in U.S. Pat. No. 5,437,778 to V. L. Hedgcoth, a magnetron sputtering system comprises a hollow longitudinal cathode that is either made from or has its interior wall coated with a material to be sputtered. No hollow cathode effect can be excited in such systems. Similarly, in U.S. Pat. No. 6,283,357 to S. Kulkarni et al. a plate of sputter target material is bonded to a sheet of cladding material and then formed into a "hollow cathode" magnetron target. In U.S. Pat. No. 6,887,356 to R. B. Ford et al. a sputtering target is claimed preferably exhibiting uniform grain structure and texture at least on the sidewalls thereof, but no hollow cathode effect is utilized. Another example is PCT Publication WO 2007/130903 to J. K. Kardokus et al., where methods of forming "hollow cathode" magnetron sputtering targets are claimed. In these targets, a metallic material is processed to produce an average grain size of less than or equal to about 30 microns. Such sputtering target preferably exhibits substantially uniform sputtering erosion, but no hollow cathode effect is utilized. Basic principles of these so-called "hollow cathode magnetrons" are explained e.g. by D. A. Glocker (SVC Technical Conference Proceedings 1995).

Since its discovery in 1974 in U.S. Pat. No. 4,166,018 to J. S. Chapin (later described by P. S. McLeod et al. 1977 and R. K. Waits 1978), the magnetron sputtering device underwent a number of improvements aimed mainly to (i) an increase of the target utilization, (ii) a possibility to sputter magnetic targets, (iii) an increase of an ion flux to the substrate, (iv) an increase of the sputtering rate, (v) an increase of the ionization level in the whole magnetron plasma. Substantial progress in tasks (i) and (ii) has been obtained by optimizing geometry and induction of the magnetic tunnels for plasma confinement, particularly by strong permanent magnets, but also by using hollow targets as explained above. Such efforts also included different systems with moving magnets and culminated in an arrangement for target utilization based on a rotating cylindrical target (U.S. Pat. No. 4,356,073 to H. E. McKelvey, filed 1981, and a number of later patents e.g., U.S. Patent Publication 2009/0260983 to M. A. Bernick, filed in 2009). A considerable advance in task (iii) was obtained by partial opening of the magnetic tunnel from so-called "closed field magnetrons" to so-called "unbalanced magnetrons" (B. Window et al. 1986). This solution allows for an enhanced presence of ions (plasma) close to the substrate, efficient biasing of the substrates and controlled growth of e.g. very hard films and special film textures. It is noteworthy that so far the progress in task (iv), i.e. in increasing the sputtering rates, has been obtained by increasing target erosion areas, while different arc evaporators rather than any sputtering devices continued to be relied upon as the fastest physical vapor deposition (PVD) systems. An increase in the ionization of the magnetron plasma (task (v)) can obviously increase the sputtering rate, such as, for example through additional ionization by an rf coil (S. M. Rossnagel et al., 1993). However, recent trends are focused rather to high power impulse magnetron sputtering (HiPIMS) systems disclosed in U.S. Pat. No. 6,296,742 to Kouznetsov (filed in 1997), where the high power peaks increase the ionization dramatically. However due to the pulsed power regime, the average coating rate barely reaches rates comparable to conventional dc magnetrons. Thus, the advantage of favorable coating properties available in high-density plasma of HiPIMS is outweighed by the necessity of complicated and expensive pulsed power generators and so far also by an unimpressive deposition rates.

A direct method of increasing the sputtering rate by increasing the ionization in the magnetron plasma using the hollow cathode has been patented by J. J. Cuomo et al. in May 1986 in U.S. Pat. No. 4,588,490 "Hollow cathode enhanced magnetron sputtering device". Cuomo et al. combine a hollow cathode as an electron-emitting device with a plasma sputter etching/deposition device such as a magnetron. The hollow cathode is utilized to provide additional ionization of the working gas during magnetron operation and can provide main ionization of the working gas at low magnetron powers. The hollow cathode utilizes thermionic electron emission to inject electrons. For this purpose, it comprises a hollow tubular member constructed of a refractory metal and a plurality of layers of electron emissive foils. The hollow cathode is powered by a dc power source independent on the magnetron power generator. In the preferred configuration, the axis of the cylindrical hollow cathode is parallel with the planar magnetron target and positioned above the target close to its edge. In order not to impede the magnetron drift current the radial position of the hollow cathode must be such that the magnetic field lines that it intersects travel to the center pole, rather than the bottom of the magnetic assembly. Thus the patent discloses an application of a thermionic hollow cathode emitting electrons, without electrical or physical impediment of the magnetron drift current, but also without magnetic enhancement of the hollow cathode plasma. The cathode should be fabricated from refractory metals (e.g. Ta). Low-pressure thermionic regimes of the hollow cathode allow for about 10-times lowering of the magnetron operation pressure, i.e. down to $4-6.7 \times 10-2$ Pa (0.3-0.5 mTorr). This type of use of the hot hollow cathode arcs as an auxiliary ionizer in magnetrons is described in the literature as "magnetrons with additional gas ionization" (J. Musil et al., 2006, p. 71-72). An important requirement in such processes is that the cathode metal should not be released and mixed with the sputtered material from the magnetron target.

Another way for involving the hollow cathode plasma in the magnetron discharge is formation of grooves or bores directly in the target in order to excite the hollow cathode effect inside these grooves or bores (J. Musil et al., 2006, pp. 91-93). Such arrangements decrease the necessary voltage for the magnetron discharge, but the sputtering rate decreases as well. Moreover, the targets have rather complicated forms and as the target is consumed during magnetron operation the depths of such hollow cathodes are reduced, requiring changes in power parameters.

In addition to their ability to generate very high-density plasmas (comparable to HiPIMS), due to the hollow cathode effect, hollow cathodes can be used for both ion sputtering and arc evaporation where the cathode itself is a PVD target. Besides dc power, the hollow cathodes can be advantageously powered by pulsed dc or ac electric power (up to the rf range), and can be used to activate gases for fast plasma-enhanced chemical vapor deposition (PE CVD) regimes. Shapes and dimensions of the cathodes can be designed for a wide range of working gas pressures from about $1.33 \times 10^{-2}$ Pa ($10^{-4}$ Torr) up to atmospheric and higher pressures. Besides conventional tube shaped cathodes, the pendulum motion of electrons can also occur between parallel conductive "plates" (with rf power even when plates are coated by dielectrics) to produce dense hollow cathode plasma. Moreover, the hollow cathode effect can be enhanced and focused in selected areas (hot zones) by suitable magnetic fields, as disclosed in U.S. Pat. No. 5,908,602 to L. Bárdos et al. (1994). Main part of the magnetic induction lines (induction vector B) in the slit between parallel linear plates of the hollow cathodes should be perpendicular to the cathode plates in order not to deflect electrons and prevent their oscillations between opposite walls. Electrons moving along vector B are not affected by the magnetic force. However, because the vector E of the electric field in the power circuit is oriented towards the anode, i.e. out of the slit, a considerable disadvantage of the static magnetic field is the tendency to force the plasma to one side of the slit depending on the orientation of magnetic induction vector B. The drift velocity of electrons is given be the vector product $(E \times B)/B^2$ (E is the vector of electric field perpendicular to a magnetic induction vector B). The drift velocity vector is perpendicular to both vectors E and B. This insufficiency can be compensated in apparatuses having rotating magnets, as disclosed in U.S. Pat. No. 6,351,075 to H. Baránková et al., where magnetic induction vector B across the hollow cathode slit is changed in both its orientation and amplitude. An obvious disadvantage of such apparatuses is the necessity of mechanical means for driving the magnets.

SUMMARY OF THE INVENTION

An object of the present invention is therefore to overcome the above described drawbacks and to provide magnetron devices boosted by magnetically enhanced dense hollow cathode plasma generated in a parallel-plate hollow cathode placed inside the magnetic field of the magnetron for supplying a dense plasma into the magnetron plasma for substrate processing.

The invention provides a magnetron plasma apparatus boosted by hollow cathode plasma for plasma processing on a substrate in a reactor, comprising a parallel plate hollow cathode with a slit wherein a hollow cathode effect can be excited, a magnetron sputtering apparatus with a magnetron target, an electric power generator for generation of plasma and a magnetic system generating a magnetron magnetic field giving form to an erosion zone on the magnetron target surface and spatial shape of the magnetron plasma.

A first aspect of the invention provides a magnetron plasma apparatus boosted by hollow cathode plasma for plasma processing wherein at least one electrically connected pair of a first hollow cathode plate and a second hollow cathode plate placed opposite to each other at a separation distance of at least 0.1 mm has an opening following an outer edge of a sputter erosion zone on a magnetron target so that a magnetron magnetic field forms a perpendicular magnetic induction component inside a hollow cathode slit between said first and second plate. Said pair of plates is connected to a first electric power generator together with said magnetron target to generate a magnetically enhanced hollow cathode plasma in at least one of a first working gas distributed in said hollow cathode slit and a second working gas admitted outside said slit in contact with a magnetron plasma generated in at least one of said first working gas and said second working gas.

A second aspect of the invention relates to a magnetron plasma apparatus boosted by hollow cathode plasma for plasma processing wherein said second hollow cathode plate is integrated in said magnetron target and said hollow cathode slit where said hollow cathode plasma is formed is created between said first hollow cathode plate and said magnetron target.

A third aspect of the invention relates to a magnetron plasma apparatus boosted by hollow cathode plasma for plasma processing wherein said pair of said first hollow cathode plate and said second hollow cathode plate are electrically insulated from said magnetron target and connected to a second electric power generator.

A fourth aspect of the invention relates to a magnetron plasma apparatus boosted by hollow cathode plasma for plasma processing wherein said magnetically enhanced hollow cathode plasma inside said hollow cathode slit forms a first hot zone on said first cathode plate and a second hot zone on said second hollow cathode plate and said first and second hot zones evaporate material from said first and second hollow cathode plates.

A fifth aspect of the invention relates to a magnetron plasma apparatus boosted by hollow cathode plasma for plasma processing wherein said magnetron target has cylindrical form in a rotatable target magnetron apparatus and said pair of said first hollow cathode plate and said second hollow cathode plate are mechanically decoupled from said magnetron target.

A sixth aspect of the invention relates to a magnetron plasma apparatus boosted by hollow cathode plasma for plasma processing wherein multiple pairs of said first hollow cathode plate and said second hollow cathode plate have annular circular openings and create a hollow cylindrical shape of said magnetron target.

A seventh aspect of the invention relates to a magnetron plasma apparatus boosted by hollow cathode plasma for plasma processing wherein at least one of said first hollow cathode plate, said second hollow cathode plate and said magnetron target is fabricated at least in some part from a different material.

An eighth aspect of the invention relates to a magnetron plasma apparatus boosted by hollow cathode plasma for plasma processing wherein said individual pairs of said first and second hollow cathode plates are out of parallel with each other or with respect to said magnetron target.

A ninth aspect of the invention relates to a magnetron plasma apparatus boosted by hollow cathode plasma for plasma processing wherein said first hollow cathode plate and said second hollow cathode plate have other than planar shapes and compose uneven forms of said hollow cathode slit.

A tenth aspect of the invention relates to a magnetron plasma apparatus boosted by hollow cathode plasma for plasma processing, wherein said magnetically enhanced hollow cathode plasma is generated in said first working gas.

Other goals and advantages of the invention will be further understood and appreciated in conjunction with the following description and accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. A variety of changes and modifications can be made within the scope of the invention without departing from the spirit thereof.

INCORPORATION BY REFERENCE

All publications, patents, and patent applications mentioned in this specification are herein incorporated by reference to the same extent as if each individual publication, patent, or patent application was specifically and individually indicated to be incorporated by reference.

F. Paschen, "2. Bohrs Heliumlinien", Annalen der Physik, IV (50) (1916) 901.

P. F. Little and A. vonEngel, "The hollow-cathode effect and the theory of glow discharges", Proc. Royal Society London, A224 (1954) 209-227.

U.S. Pat. No. 4,521,286 "Hollow cathode sputter etcher" filed by C. M. Horwitz in March 1984.

L. Bárdos and V. Dusek, "High rate jet plasma-assisted chemical vapour deposition", Thin Solid Films 158 (1988) 265-270.

U.S. Pat. No. 4,966,677 "Cathode sputtering apparatus on the magnetron principle with a hollow cathode and a cylindrical target" filed by H. Aichert et al. in April 1989.

U.S. Pat. No. 5,437,778 "Slotted cylindrical hollow cathode/magnetron sputtering device" filed by V. L. Hedgcoth in November 1993.

U.S. Pat. No. 6,283,357 "Fabrication of clad hollow cathode magnetron sputter targets" filed by S. Kulkarni et al. in August 1999

U.S. Pat. No. 6,887,356 "Hollow cathode target and methods of making same" filed by R. B. Ford et al. in November 2001

PCT Publication WO 2007/130903 "Hollow cathode magnetron sputtering targets and methods of forming hollow cathode magnetron sputtering targets" filed by J. K. Kardokus et al. in May 2006.

D. A. Glocker, "Principles and Applications of Hollow Cathode Magnetron Sputtering Sources", 38th Annual SVC Technical Conference Proceedings (1995), pp. 298-302, ISSN 0737-5921.

U.S. Pat. No. 4,166,018 "Sputtering process and apparatus" filed by J. S. Chapin in January 1974.

P. S. McLeod and L. D. Hartsough, "High rate sputtering of aluminum for metallization of integrated circuits", J. Vac. Sci. Technol. 14 (1) (1977) 263-265.

R. K. Waits, "Planar magnetron sputtering", J. Vac. Sci. Technol. 15 (2) (1978) 179-187.

U.S. Pat. No. 4,356,073 "Magnetron cathode sputtering apparatus" filed by H. E. McKelvey in February 1981.

U.S. Patent Publication 2009/0260983 "Cylindrical magnetron" filed by M. A. Bernick in April 2009.

B. Window and N. Savvides, "Charged particle fluxes from planar magnetron sputtering sources", J. Vac. Sci. Technol. A4 (2) (1986) 196-202.

S. M. Rossnagel and J. Hopwood, "Magnetron sputter deposition with high levels of metal ionization", Appl. Phys. Letters 63 (1993) 3285-3287.

U.S. Pat. No. 6,296,742 "Method and apparatus for magnetically enhanced sputtering", filed by V. Kouznetsov in December 1997.

U.S. Pat. No. 4,588,490 "Hollow cathode enhanced magnetron sputtering device" filed by J. J. Cuomo et al. in May 1986

J. Musil, J. Vlcek and P. Baroch, "Magnetron discharges for thin films plasma processing", Chapter 3, pp. 67-110, in "Materials Surface Processing by Directed Energy Techniques", ed. by Yves Pauleau, EMRS Book Series, Elsevier, 2006

U.S. Pat. No. 5,908,602 "Apparatus for generation of a linear arc discharge for plasma processing", filed by L. Bárdos and H. Baránková, priority November 1994.

U.S. Pat. No. 6,351,075 "Plasma processing apparatus having rotating magnets", filed by H. Baránková and L. Bárdos, priority November 1997.

BRIEF DESCRIPTION OF THE DRAWING(S)

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DESCRIPTION OF THE INVENTION

Throughout the drawings, the same reference numbers are used for similar or corresponding elements.

The invention provides systems and methods for the plasma processing on substrates, such as, for example sputtering and dry etching. The invention provides also systems and methods with contribution of arc evaporation and/or sputtering of the hollow cathode plate material into the magnetron plasma and for processing on the substrates. Ionized and activated particles in the apparatus according to this invention can be used in various regimes for ion plating, activated reactive evaporation, reactive sputtering, evaporation and combined regimes, etc. It is possible to utilize direct processes incorporating sputtered and evaporated materials from magnetron target and from hollow cathode plates with or without an inert working gas, as well as reactive processes incorporating chemical reactions of these materials with activated reactive working gases, different chemical precursors, vapors, etc. Various aspects of the invention described herein may be applied to any of the particular applications set forth below or in any other type of plasma processing including, but not limited to combinations of several apparatuses according to this invention, or combinations with other types of plasma systems, like microwave plasma systems, arc evaporators, laser plasma sources, etc. It shall be also understood that different aspects of the invention can be appreciated individually, collectively, or in combination with each other.

Figure 1:
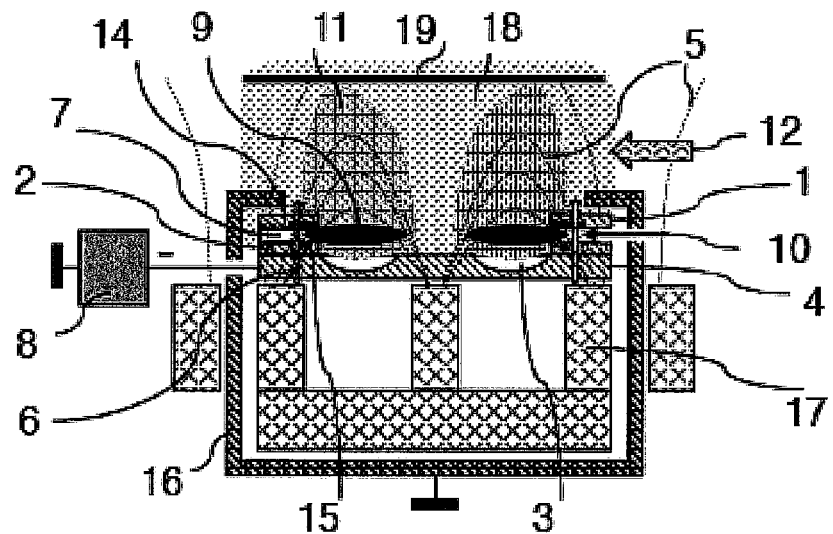
FIG. 1 is a schematic view of a first embodiment and explanation of a second embodiment according to the present invention showing an example of magnetron plasma apparatus boosted by hollow cathode plasma for plasma processing on a substrate in a reactor at gas pressure below 6.65×103 Pa (50 Torr).

Referring to FIG. 1, a first embodiment of a magnetron plasma apparatus boosted by hollow cathode plasma for plasma processing on a substrate in a reactor according to the present invention will be described. In practically implemented embodiments gas pressures below about 6.65×103 Pa (50 Torr) can be used. In the present embodiment, at least one electrically connected pair of a first hollow cathode plate 1 and a second hollow cathode plate 2 placed parallel and opposite to each other at a separation distance of 0.5 mm between them has an opening along an outer edge of a sputter erosion zone 3 on a magnetron target 4. The separation of 0.5 mm is considered as a typical practical lowest limit, even if separation distances down to about 0.1 mm would be possible to make the apparatus operable. The pair of cathode plates is placed so that a magnetron magnetic field 5 forms a perpendicular magnetic induction component 6, in this embodiment of at least 10-2 Tesla, inside a hollow cathode slit 7 between plates 1 and 2, and the pair of plates 1 and 2 is electrically connected to a first electric power generator 8 together with target 4 to generate a magnetically enhanced hollow cathode plasma 9 in a first working gas 10 distributed in the hollow cathode slit 7 in contact with a magnetron plasma 11 generated in the first working gas 10 and in a second working gas 12 admitted outside slit 7. Thus the apparatus according to the present embodiment utilizes the magnetic field 5 of the magnetron for generation of the magnetically enhanced hollow cathode plasma 9 inside slit 7. For further improved performance of the magnetically enhanced hollow cathode plasma 9 the depth of the slit 7 given by the widths of plate 1 and plate 2 should be at least of twice the distance between plate 1 and 2. The magnetron magnetic field 5 can have different shapes. A typical tunnel-shaped part of the field confines in the present embodiment the plasma above the target and defines the shape of the sputter erosion zone 3 on the target 4. The magnetic induction at the outer edge of the erosion zone 3 is close to one pole of a magnetron magnetic system 17 and can in the present embodiment generate the perpendicular magnetic induction component 6 of at least 10-2 Tesla inside the hollow cathode slit 7 to form the magnetically enhanced hollow cathode plasma 9. In so-called unbalanced magnetrons, the magnetic system 17 contains also means for partial unbalancing of the tunnel magnetic field to allow more ions to escape the magnetic tunnel and travel to a substrate 19. The unbalancing of the field can be provided also without use of the additional means by positioning of magnets in the system 17 under the target 4. Depending on power of the electric generator 8, an ion bombardment inside the hollow cathode slit 7 from the magnetically enhanced hollow cathode plasma can form first and second hot zones 14 and 15 at respective cathode plates 1 and 2. The temperature of the respective hot zones depends on the cooling effect from the magnetron target, thickness of the respective plates, as well as on the thermal conductivity of the plates. Therefore, in various embodiments, the hot zone 15 at the second plate 2 at the magnetron target can acquire lower temperature than the first hot zone 14 at the first plate 1. The magnetically enhanced hollow cathode plasma 9 expands from the slit 7 and interacts with the magnetron plasma 11 to compose a resulting processing plasma 18 that can contain at least one of ionized material of the magnetron target 4, ionized first working gas 10, ionized second working gas 12 and ionized sputtered and/or evaporated material particles from the hollow cathode plates 1 and 2. In different embodiment, the resulting processing plasma can contain any combination or subset of these components. In a typical embodiment, the resulting processing plasma 18 comprises ionized material of the magnetron target 4, ionized first working gas 10 and ionized second working gas 12. In the particular embodiment of FIG. 1, the magnetically enhanced hollow cathode plasma can be generated in the first working gas. In other embodiments, the magnetically enhanced hollow cathode plasma is generated in the second working gas. The working gases may also in different embodiment be composed from several components. In a typical embodiment, the first hollow cathode plate 1, the second hollow cathode plate 2 and the magnetron target 4 can be fabricated in the same material. However, in other embodiments, at least one of the first hollow cathode plate 1, the second hollow cathode plate 2 and the magnetron target 4 can be fabricated at least in some part from a different material. In other words, the first hollow cathode plate 1, the second hollow cathode plate 2 and/or the magnetron target 4 may be composed of parts of different materials, or one or two of the first hollow cathode plate 1, the second hollow cathode plate 2 and/or the magnetron target 4 may be composed of a different material compared to the other ones. In such a way, different compositions of the resulting processing plasma 18 can be achieved. Thus the processing plasma 18 contains high density of ions for plasma processing on the substrate 19. If suitable in a simple modification of the first embodiment in FIG. 1 (not shown) the second hollow cathode plate 2 can be integrated directly into the magnetron target 4. However in many practical cases the second hollow cathode plate 2 can be used for a mechanical holding of the magnetron target 4 on a cooled holder (not shown) of the target 4. In such embodiments, there is a direct mechanical attachment between the second hollow cathode plate 2 and the target 4.

Figure 2:
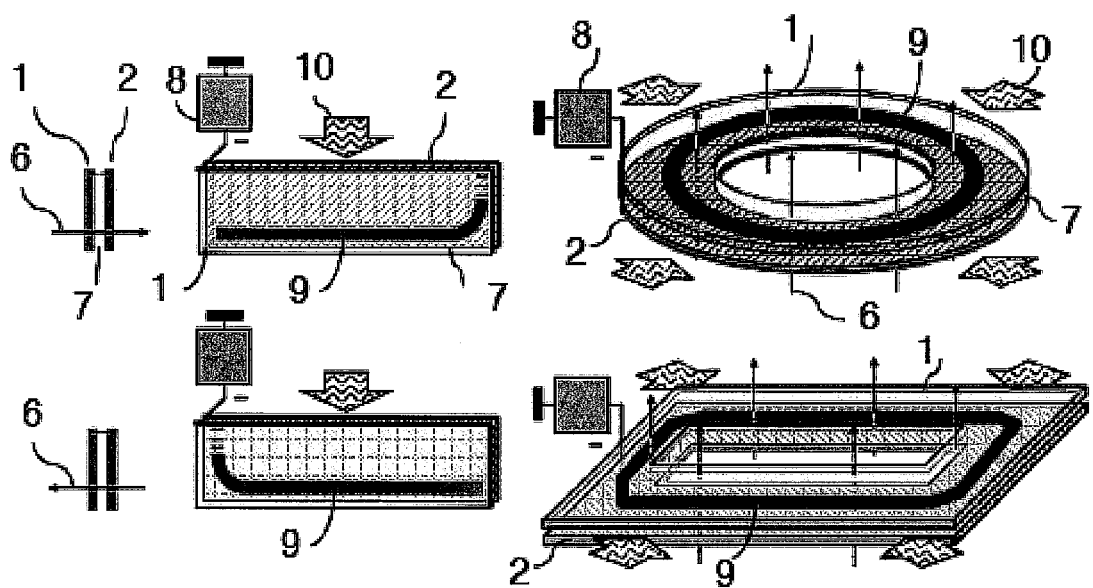
FIG. 2 is a view of magnetized hollow cathode plasma generated by different parallel-plate hollow cathodes in a perpendicular magnetic field explaining preferred embodiments according to the present invention.

FIG. 2 is a view of magnetized hollow cathode plasma generated by different parallel-plate hollow cathodes in a perpendicular magnetic field. It is shown that the perpendicular magnetic induction component 6 in a slit 7 of a parallel-plate hollow cathode composed of plate 1 (shown in a semi-transparent manner) and plate 2, described for example in U.S. Pat. Nos. 5,908,602 and 6,351,075, causes side drifts of the magnetically enhanced hollow cathode plasma 9 depending on orientation of the component 6. If the plates form a closed circumferential shape of the hollow cathode slit 7 the magnetically enhanced hollow cathode plasma 9 has a uniform circumferential shape independent on orientation of the perpendicular component 6, e.g. shape of a circle or a racetrack, as shown in FIG. 2. This property allows for utilization of the magnetron magnetic field 5 and incorporation of these circumferential parallel-plate hollow cathodes with the magnetron target 4 according to the present invention, as shown in FIG. 1. Thus the apparatus according to the invention can be applied to arbitrary forms of the planar magnetrons (circular, rectangular triangular, polygonal, etc.).

EXAMPLES

Figure 3:
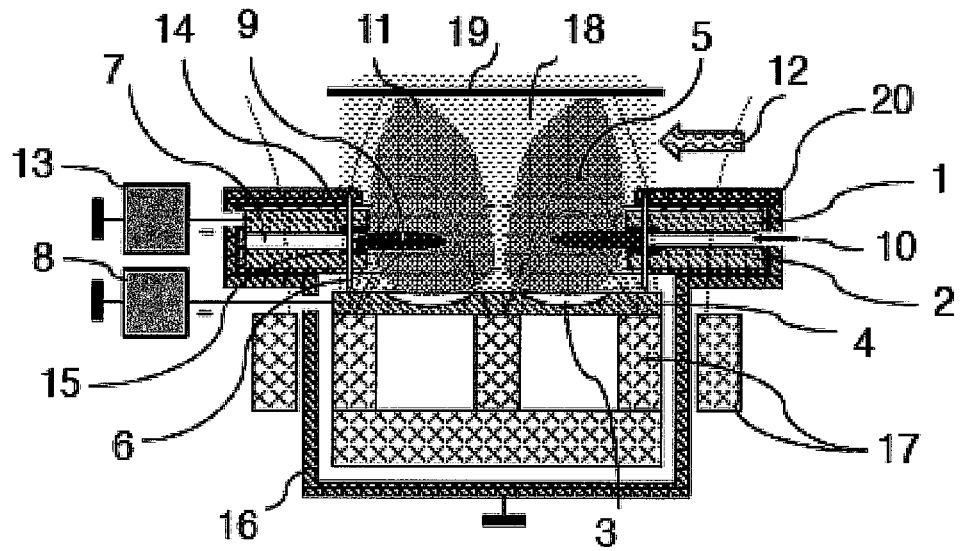
FIG. 3 is a schematic view of an example of third embodiment according to the present invention, where the parallel plate hollow cathode is electrically insulated from the magnetron target.

Referring to FIG. 3, a schematic view of an example of a third embodiment according to the present invention is explained. In this embodiment, at least one electrically connected pair of the first hollow cathode plate 1 and the second hollow cathode plate 2 is electrically insulated from the magnetron target 4, for example by an insulator 20. Plates 1 and 2 are placed opposite to each other at a separation distance of at least 0.5 mm and have an opening following an outer edge of the sputter erosion zone 3 on a magnetron target 4 so that the magnetron magnetic field 5 forms a perpendicular magnetic induction component 6 of at least $10^{-2}$ Tesla inside a hollow cathode slit 7 between plates 1 and 2. The plates 1 and 2 are electrically connected to a second electric power generator 13 independent from the first electric power generator 8 powering the magnetron target 4. The magnetically enhanced hollow cathode plasma 9 is generated in a first working gas 10 distributed in the hollow cathode slit 7 in contact with a magnetron plasma 11 generated in the first working gas 10 and in a second working gas 12 admitted outside slit 7. Generator 13 supplies enough power for an ion bombardment inside the hollow cathode slit 7 by the magnetically enhanced hollow cathode plasma 9 which forms first and second hot zones 14 and 15 at respective cathode plates 1 and 2. An advantage of this embodiment is an independent control of the magnetron plasma 11 and the magnetically enhanced hollow cathode plasma 9 and consequently respective yields of sputtered and evaporated materials in the resulting processing plasma 18 at the substrate 19.

Figure 4:
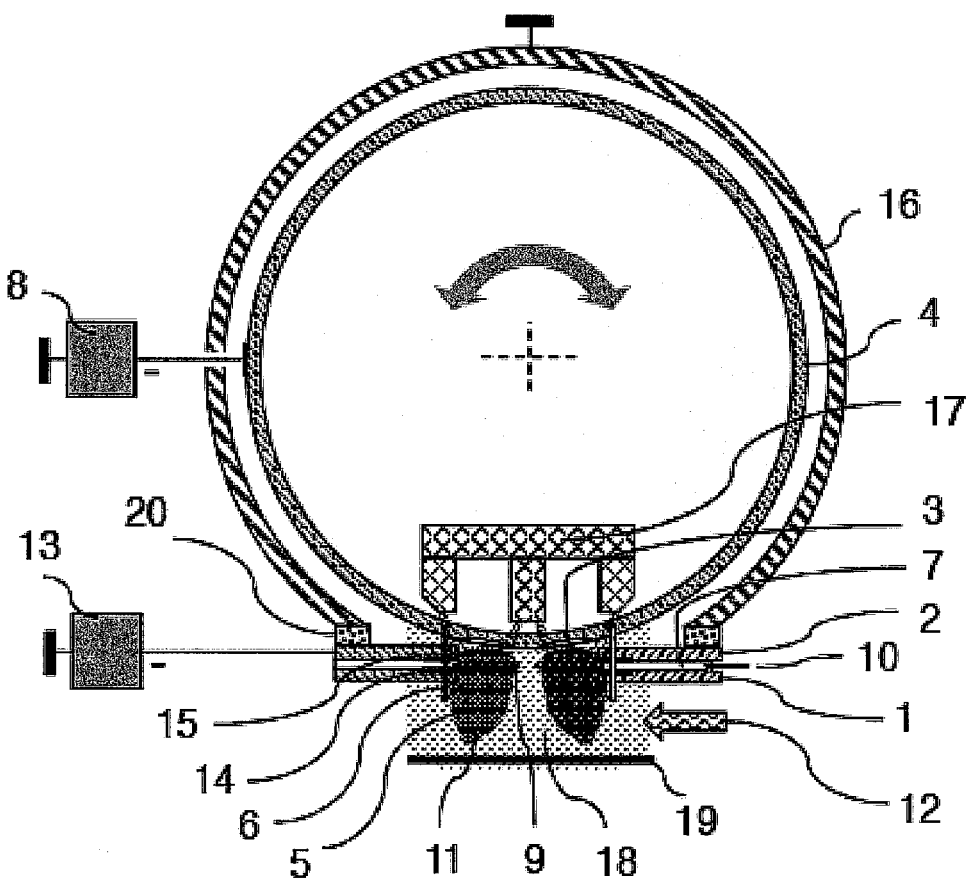
FIG. 4 is a schematic view of an example of a fourth embodiment according to the present invention, where the magnetron target has cylindrical form in a rotatable target magnetron apparatus.

Referring to FIG. 4, a schematic view of an example of a fourth embodiment according to the present invention is explained. In this embodiment the magnetron target 4 has cylindrical form in a rotatable target magnetron apparatus and the pair of the first hollow cathode plate 1 and second hollow cathode plate 2 is mechanically decoupled from rotating magnetron target 4. In this embodiment, the magnetically enhanced hollow cathode plasma 9 can be generated by the second electric power generator 13 independently from the magnetron target 4, but also together with the magnetron target from the same first electric power generator 8. In this schematic view all reference numbers are listed in the LIST OF THE USED REFERENCE NUMBERS below.

Figure 5:
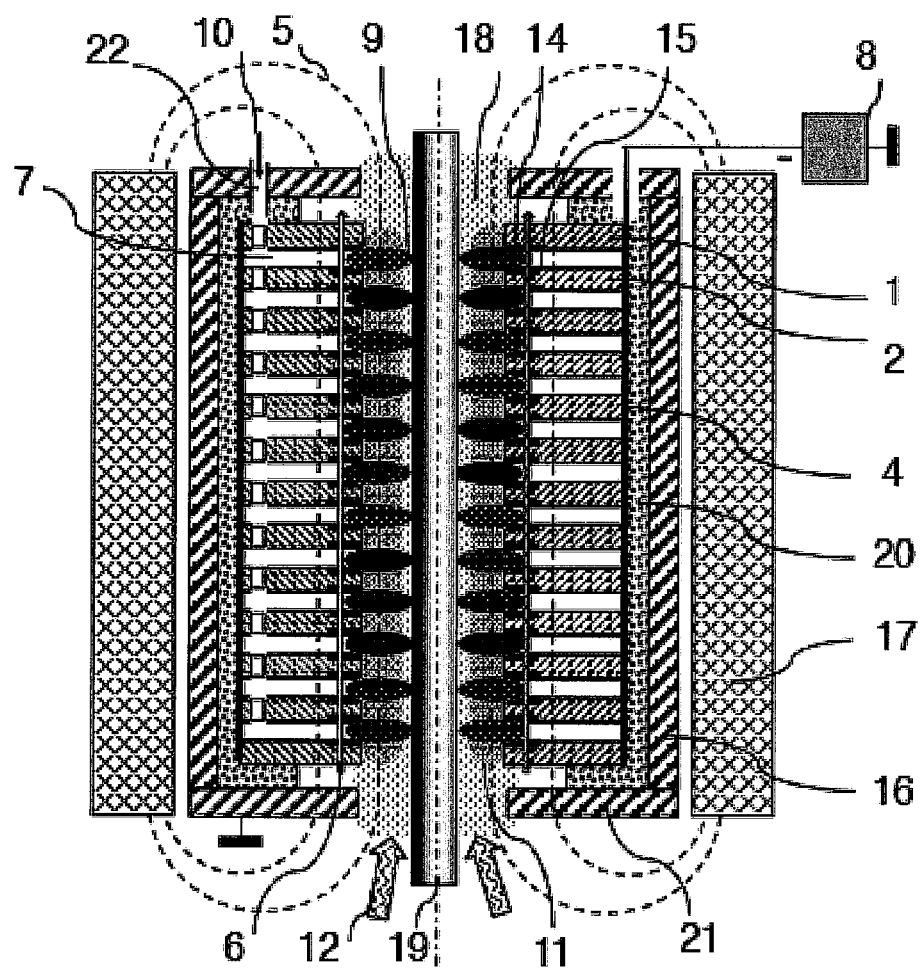
FIG. 5 is a schematic view of an example of a fifth embodiment according to the present invention, where multiple pairs of hollow cathode plates create a hollow cylindrical magnetron target.

Referring to FIG. 5 a schematic view of an example of a fourth embodiment according to the present invention is explained. In this embodiment multiple pairs of the first hollow cathode plate 1 and second hollow cathode plate 2 have annular circular openings and create a hollow cylindrical magnetron target 4 wherein the second hollow cathode plate 2 is the first hollow cathode plate 1 of the adjacent pair of plates. The target is electrically connected to the first electric power generator 8 and is electrically insulated from the anode 16 by an insulator 20. Anode 16 locks the target and the insulator 20 on the sides by side closures 21. In this embodiment the first working gas 10 is distributed into all individual hollow cathode slits 7 by at least one gas distributor channel 22. A feasible modification of this embodiment (not shown) is a multiple magnetron target 4 consisting of multiple target segments each containing one or more pairs of the first hollow cathode plate 1 and second hollow cathode plate 2, wherein each target segment is encapsulated in a corresponding segment of the insulator 20 and locked into a corresponding segment of the anode 16 with closures 21. In this modification, a common first electric power generator 8 can be used simultaneously in all parallel segments, or multiple generators can be used for powering of each target segment separately. In this embodiment the apparatus is suitable for processing of axially positioned cylindrical or round types of substrate 19. In this schematic view all reference numbers are listed in the LIST OF THE USED REFERENCE NUMBERS below.

Figure 6:
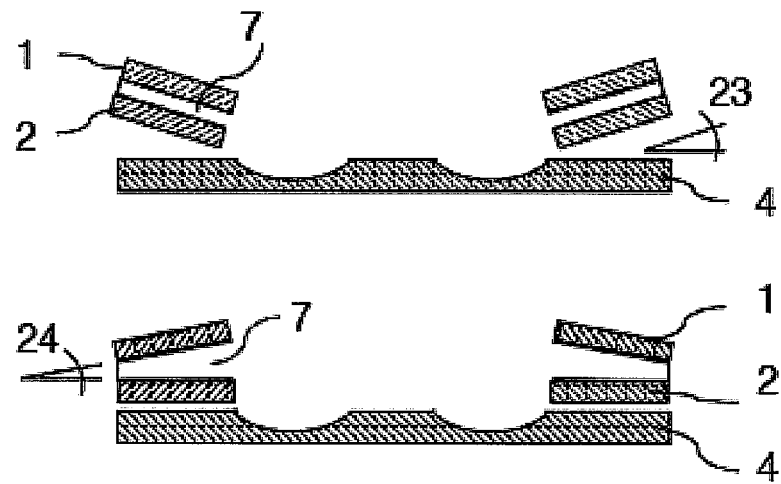
FIG. 6 is a schematic view of two examples of another alternatives according to the present invention, where hollow cathode plates are not in parallel with each other and/or with the magnetron target.

Referring to FIG. 6, schematic views of examples of still more embodiments according to the present invention are explained. In these examples, the pairs of plates 1 and 2 are not in parallel with the magnetron target 4 and can form an angle 23 with respect to the target 4. Angle 23 can have also an opposite orientation to that shown in FIG. 6. Also, hollow cathode plates 1 and 2 may not be positioned in parallel with each other and can form an angle 24 in both orientations, where the hollow cathode slit 7 is either more opened or more closed towards the target 4. The options explained schematically in FIG. 6 can be used in different combinations. Another option is that the first hollow cathode plate 1 and the second hollow cathode plate 2 have other than planar shapes and compose uneven forms of the hollow cathode slit 7. Still other options are based on different combinations of working gases, as well as on possibility to operate the magnetically enhanced hollow cathode plasma 9 in the slit 7 without use of the first working gas 10 (the inlet of the gas 10 may be closed) and only in the second working gas 12. Thus the magnetically enhanced hollow cathode plasma 9 and/or the magnetron plasma 11 can be generated only in the first working gas 10 or only in the second working gas 12 where any of the working gases 10 and 12 can be composed from several components. In this schematic view all reference numbers are listed in the LIST OF THE USED REFERENCE NUMBERS below.

High-density plasmas generated by hollow cathodes in accordance with the present invention can advantageously be used in processing procedures requiring very dense plasmas, like in the HiPIMS. However, the plasma generated by the apparatus according to the present invention brings more advantages, for example possibility of high processing and deposition rates, high activation degree, rapid plasma chemical reactions and generation of radicals, high rate etching, an improved stability and control of plasma processes, an efficient control of properties of deposited films including new film properties like superhard or superelastic films, etc. The plasma processing according to the present invention enables also different hybrid processes when combining for example sputtering and evaporation regimes, PE CVD and sputtering and/or evaporation regimes, incorporation of particles from different materials, deposition of different composite films, etc. The invention may offer significant advantages with respect to HiPIMS, including, but not limited to possibility of continuous processing and use of more simple and cheaper power generators, such as for example dc, pulsed dc, ac and rf. Moreover, as the HiPIMS represents a generation mode of the magnetron plasma rather than the magnetron itself the magnetron plasma apparatus according to the present invention can be used also in HiPIMS regimes. A further advantage of different embodiments of the apparatus according to this invention is capability of operating at relatively high pressures as compared to typical pressures of 0.13-1.3 Pa (1-10 mTorr) for magnetron sputtering or etching. This is enabled by the magnetically enhanced hollow cathodes, which can work at high pressures and supply high-density plasma into the magnetron. It is necessary, however, to adjust the geometry of the hollow cathode and the whole system, the position of the substrate and the gas flow rates according to the required gas pressure due to differences in the mean free paths of plasma particles.

While preferable embodiments of the present invention have been shown and described herein, it will be obvious to those skilled in the art that such embodiments are provided as an example only. Numerous variations, changes, and substitutions will now occur to those skilled in the art without departing from the invention. It should be understood that various alternatives to the embodiments of the invention described herein could be employed in practicing the invention. It is intended that the following claims define the scope of the invention and that methods and structures within the scope of these claims and their equivalents be covered thereby.

LIST OF THE USED REFERENCE NUMBERS

1—first cathode plate
2—second cathode plate
3—sputter erosion zone
4—magnetron target
5—magnetic field
6—perpendicular magnetic induction component
7—hollow cathode slit
8—first electric power generator
9—magnetically enhanced hollow cathode plasma
10—first working gas
11—magnetron plasma
12—second working gas
13—second electric power generator
14—first hot zone
15—second hot zone
16—anode
17—magnetic system
18—processing plasma
19—substrate
20—insulator
21—anode side closures
22—gas distributor channel
23—angle between hollow cathode plates 1 and 2 and the magnetron target 4
24—angle between cathode plate 1 and 2

The invention claimed is:

1. A magnetron plasma apparatus boosted by hollow cathode plasma for plasma processing on a substrate in a reactor, comprising (a) a parallel plate hollow cathode with a slit wherein a hollow cathode effect can be excited, and (b) a magnetron sputtering apparatus with a magnetron target, a first electric power generator for generation of plasma and a magnetic system generating a magnetron magnetic field giving form to an erosion zone on a surface of said magnetron target and spatial shape of a magnetron plasma, wherein:
   at least one electrically connected pair of a first hollow cathode plate and a second hollow cathode plate placed opposite to each other at a separation distance of at least 0.1 mm has an opening following an outer edge of a sputter erosion zone on said magnetron target so that said magnetron magnetic field forms a perpendicular magnetic induction component inside a hollow cathode slit between said plates; and
   said pair of plates is connected to said first electric power generator together with said target to generate a magnetically enhanced hollow cathode plasma in at least one of a first working gas distributed in said hollow cathode slit and a second working gas admitted outside said slit, said magnetically enhanced hollow cathode plasma in contact with a magnetron plasma generated in at least one of said first working gas and said second working gas.

2. The apparatus according to claim 1, wherein said second hollow cathode plate is integrated in said magnetron target and said hollow cathode slit where said hollow cathode plasma is formed is created between said first hollow cathode plate and said target.

3. The apparatus according to claim 1, wherein said magnetically enhanced hollow cathode plasma inside said hollow cathode slit forms a first hot zone on said first cathode plate and a second hot zone on said second hollow cathode plate and said hot zones evaporate material from said hollow cathode plates.

4. The apparatus according to claim 1, wherein said magnetron target has cylindrical form in a rotatable target magnetron apparatus and said pair of said first hollow cathode plate and said second hollow cathode plate are mechanically decoupled from said magnetron target.

5. The apparatus according to claim 1, wherein multiple pairs of said first hollow cathode plate and said second hollow cathode plate have annular circular openings and create a hollow cylindrical shape of said magnetron target.

6. The apparatus according to claim 1, wherein at least one of said first hollow cathode plate, said second hollow cathode plate and said magnetron target is fabricated at least in some part from a different material.

7. The apparatus according to claim 1, wherein said hollow cathode plates are out of parallel with respect to said magnetron target.

8. The apparatus according to claim 1, wherein said first hollow cathode plate and said second hollow cathode plate have other than planar shapes and compose uneven forms of said hollow cathode slit.

9. The apparatus according to claim 1, wherein said magnetically enhanced hollow cathode plasma is generated in said first working gas.

10. The apparatus according to claim 1, wherein said hollow cathode plates form a closed circumferential shape of said hollow cathode slit.

11. The apparatus according to claim 1, wherein said perpendicular magnetic induction component inside said hollow cathode slit is at least 10-2 Tesla.

12. The apparatus according to claim 6, wherein (i) at least one of said first hollow cathode plate and said second hollow cathode plate comprises a different material than said magnetron target, or (ii) said first hollow cathode plate comprises a different material than said second hollow cathode plate.

13. The apparatus according to claim 10, wherein said closed circumferential shape is a circle or a racetrack.

14. The apparatus according to claim 10, wherein said magnetron sputtering apparatus is circular, rectangular, triangular or polygonal.

15. The apparatus according to claim 1, wherein said magnetic system and said magnetron magnetic field are stationary.

16. The apparatus according to claim 1, wherein at least a portion of electrons emitted from said first hollow cathode plate or said second hollow cathode plate oscillate between inner walls of said first hollow cathode plate and said second hollow cathode plate.

17. The apparatus according to claim 1, wherein said magnetically enhanced hollow cathode plasma interacts with said magnetron plasma generated by said magnetron apparatus.

18. A magnetron plasma apparatus boosted by hollow cathode plasma for plasma processing on a substrate in a reactor, comprising (a) a parallel plate hollow cathode with a slit wherein a hollow cathode effect can be excited, and (b) a magnetron sputtering apparatus with a magnetron target, a first electric power generator for generation of plasma and a magnetic system generating a magnetron magnetic field giving form to an erosion zone on a surface of said magnetron target and spatial shape of a magnetron plasma, wherein:

at least one electrically connected pair of a first hollow cathode plate and a second hollow cathode plate placed opposite to each other at a separation distance of at least 0.1 mm has an opening following an outer edge of a sputter erosion zone on said magnetron target so that said magnetron magnetic field forms a perpendicular magnetic induction component inside a hollow cathode slit between said plates;

said target is connected to said first electric power generator; and said pair of said first hollow cathode plate and said second hollow cathode plate is electrically insulated from said magnetron target and connected to a second electric power generator to generate a magnetically enhanced hollow cathode plasma in at least one of a first working gas distributed in said hollow cathode slit and a second working gas admitted outside said slit, said magnetically enhanced hollow cathode plasma in contact with a magnetron plasma generated in at least one of said first working gas and said second working gas.

19. The apparatus according to claim 18, wherein said second electric power generator is independent from said first electric power generator.

20. The apparatus according to claim 18, wherein said perpendicular magnetic induction component inside said hollow cathode slit is at least 10-2 Tesla.

21. A magnetron plasma apparatus boosted by hollow cathode plasma for plasma processing on a substrate in a reactor, comprising (a) a hollow cathode with a slit wherein a hollow cathode effect can be excited, and (b) a magnetron sputtering apparatus with a magnetron target, a first electric power generator for generation of plasma and a magnetic system generating a magnetron magnetic field giving form to an erosion zone on a surface of said magnetron target and spatial shape of a magnetron plasma, wherein:

at least one electrically connected pair of a first hollow cathode plate and a second hollow cathode plate placed opposite to each other at a separation distance of at least 0.1 mm has an opening following an outer edge of a sputter erosion zone on said magnetron target so that said magnetron magnetic field forms a perpendicular magnetic induction component inside a hollow cathode slit between said plates;

said pair of plates is connected to said first electric power generator together with said target to generate a magnetically enhanced hollow cathode plasma in at least one of a first working gas distributed in said hollow cathode slit and a second working gas admitted outside said slit, said magnetically enhanced hollow cathode plasma in contact with a magnetron plasma generated in at least one of said first working gas and said second working gas; and said hollow cathode plates are out of parallel with each other and/or at least one of said hollow cathode plates is out of parallel with respect to said magnetron target.

22. The apparatus according to claim 21, wherein said hollow cathode plates are out of parallel with each other and/or said pair of said hollow cathode plates is out of parallel with respect to said magnetron target.

* * * * *